(12) United States Patent
Kato et al.

(10) Patent No.: US 11,937,410 B2
(45) Date of Patent: Mar. 19, 2024

(54) PACKAGE-TYPE FLUID MACHINE

(71) Applicant: Hitachi Industrial Equipment Systems Co., Ltd., Tokyo (JP)

(72) Inventors: Fuminori Kato, Tokyo (JP); Yoshiyuki Kanemoto, Tokyo (JP); Hiroaki Saito, Tokyo (JP); Daichi Oka, Tokyo (JP); Akihiro Yamamoto, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 365 days.

(21) Appl. No.: 17/264,807

(22) PCT Filed: Sep. 13, 2018

(86) PCT No.: PCT/JP2018/033914
§ 371 (c)(1),
(2) Date: Jan. 30, 2021

(87) PCT Pub. No.: WO2020/054008
PCT Pub. Date: Mar. 19, 2020

(65) Prior Publication Data
US 2021/0289670 A1    Sep. 16, 2021

(51) Int. Cl.
*H05K 7/20* (2006.01)
*F04B 23/04* (2006.01)
(Continued)

(52) U.S. Cl.
CPC ......... *H05K 7/20909* (2013.01); *F04B 23/04* (2013.01); *F04B 35/04* (2013.01);
(Continued)

(58) Field of Classification Search
CPC ........ F04B 39/066; F04B 23/04; F04B 41/06; F04B 53/08; H05K 7/20909; F04C 29/04; F04C 29/047
See application file for complete search history.

(56) References Cited

U.S. PATENT DOCUMENTS 3,989,415 A * 11/1976 Van-Hee ............... G10K 11/16
                                                          181/224
4,492,533 A *  1/1985 Tsuge ................... F04B 39/066
                                                          417/372
(Continued)

FOREIGN PATENT DOCUMENTS

CN       103850942 A    6/2014
JP         9-68163 A    3/1997
(Continued)

OTHER PUBLICATIONS

International Search Report (PCT/ISA/210) issued in PCT Application No. PCT/JP 2018/033914 dated Dec. 11, 2018 (five (4) pages).
(Continued)

*Primary Examiner* — Christopher S Bobish
(74) *Attorney, Agent, or Firm* — Crowell & Moring LLP

(57) ABSTRACT

A package-type fluid machine includes a compressor unit including a compression portion that compresses a fluid, a motor that drives the compression portion, and a cooling fan that is driven by the motor; a machine chamber in which the compressor unit is disposed; an inverter chamber which is adjacent to the machine chamber and in which an inverter is disposed; a partition wall that partitions off the machine chamber from the inverter chamber and has an opening; and an inverter intake port that is disposed in the inverter chamber to take in a cooling gas. The cooling fan is disposed on a side of the machine chamber, the opening being located on the side. The cooling fan is driven to cause the cooling gas to flow from the inverter intake port to the opening to cool the inverter.

12 Claims, 6 Drawing Sheets

(51) Int. Cl.
  *F04B 35/04* (2006.01)
  *F04B 39/06* (2006.01)
  *F04B 41/06* (2006.01)
  *F04B 53/08* (2006.01)
  *F04C 29/04* (2006.01)

(52) U.S. Cl.
  CPC ............ *F04B 39/066* (2013.01); *F04B 41/06* (2013.01); *F04B 53/08* (2013.01); *F04C 29/04* (2013.01); *F04C 29/047* (2013.01)

(56) References Cited

U.S. PATENT DOCUMENTS

| | | | | |
|---|---|---|---|---|
| 5,507,618 | A * | 4/1996 | Kubo | F04C 23/00 417/372 |
| 5,672,052 | A * | 9/1997 | Ishida | F04D 29/664 417/423.5 |
| 6,447,264 | B1 * | 9/2002 | Lucas | F04B 39/066 417/313 |
| 6,790,012 | B2 * | 9/2004 | Sharp | F04B 39/0033 417/313 |
| 6,793,465 | B2 * | 9/2004 | Stallings | F04B 39/0033 417/313 |
| 8,179,016 | B2 * | 5/2012 | Asano | F04C 29/0085 310/49.42 |
| 9,476,416 | B2 * | 10/2016 | Chen | F04B 39/16 |
| 9,528,506 | B2 * | 12/2016 | Yoshida | F04B 39/066 |
| 9,989,073 | B2 * | 6/2018 | Hwang | F04D 29/666 |
| 10,181,770 | B2 * | 1/2019 | Janscha | A47B 96/00 |
| 10,227,981 | B2 * | 3/2019 | Kanaizumi | F01C 21/007 |
| 10,900,358 | B2 * | 1/2021 | Yano | F04C 29/06 |
| 11,026,354 | B2 * | 6/2021 | Ledezma | H05K 7/20927 |
| 2014/0154122 | A1 | 6/2014 | Sadakata et al. | |
| 2016/0097389 | A1 * | 4/2016 | Yamazaki | F04C 29/04 417/410.5 |
| 2017/0130975 | A1 | 5/2017 | Shoemaker et al. | |

FOREIGN PATENT DOCUMENTS

| | | |
|---|---|---|
| JP | 2005-30227 A | 2/2005 |
| JP | 2005-171958 A | 6/2005 |
| JP | 2008-133811 A | 6/2008 |
| JP | 2014-51946 A | 3/2014 |
| JP | 2014-66252 A | 4/2014 |
| JP | 2015-203345 A | 11/2015 |
| JP | 2016-75159 A | 5/2016 |

OTHER PUBLICATIONS

Japanese-language Written Opinion (PCT/ISA/237) issued in PCT Application No. PCT/JP2018/033914 dated Dec. 11, 2018 (three (3) pages).
Extended European Search Report issued in European Application No. 18933583.9 dated Apr. 4, 2022 (seven (7) pages).
Chinese-language Office Action issued in Chinese Application No. 201880094957.3 dated Feb. 8, 2022 with English translation (14 pages).

* cited by examiner

PACKAGE-TYPE FLUID MACHINE

TECHNICAL FIELD

The present invention relates to a package-type fluid machine, particularly to a package-type fluid machine suitable for cooling an inverter.

BACKGROUND ART

There is known a gas compressor that generates compressed gas and is used as a power source in a production line or an air source for a machine tool, a press machine, an air blower, or the like. The gas compressor includes a compression portion that compresses the gas in a compression chamber formed by a casing, and the compressed gas is discharged from a discharge port to a gas tank via a discharge pipe.

In addition, there is a package-type fluid machine in which a compression portion, a motor that drives the compression portion, a control circuit, an operation panel, and the like are integrated into a package to save space. In the package-type fluid machine, the compression portion and an inverter are required to be cooled.

There is Patent Document 1 as a background art relating to the cooling of a package-type fluid machine. In Patent Document 1, a compression portion is provided with a cooling fan. Further, an inverter is provided in an intake path through which cooling air generated by the cooling fan flows. It is described that a package-type compressor in which restriction on the disposition of components is reduced to improve productivity while cooling of the inverter is secured can be obtained with such a configuration.

CITATION LIST

Patent Document

Patent Document 1: JP 2016-75159 A

SUMMARY OF THE INVENTION

Problems to be Solved by the Invention

In the package-type compressor disclosed in Patent Document 1, the compression portion to which the cooling fan is attached is disposed below a motor, and the inverter is disposed in an upper portion with respect to the compression portion. In addition, the inverter and the cooling fan are separated from each other by the length in a lateral direction of the motor, and the interval between an intake port and the cooling fan is long. For this reason, there is a possibility that the flow rate of the cooling air suctioned by the cooling fan is reduced to cause a decrease in cooling efficiency.

An object of the present invention is to provide a package-type fluid machine in which the cooling efficiency of an inverter is improved.

Solutions to Problems

According to one exemplary example of the present invention, there is provided a package-type fluid machine including: a compressor unit including a compression portion that compresses a fluid, a motor that drives the compression portion, and a cooling fan that is driven by the motor; a machine chamber in which the compressor unit is disposed; an inverter chamber which is adjacent to the machine chamber and in which an inverter is disposed; a partition wall that partitions off the machine chamber from the inverter chamber and has an opening; and an inverter intake port that is disposed in the inverter chamber to take in a cooling gas. The cooling fan is disposed on a side of the machine chamber, the opening being located on the side. The cooling fan is driven to cause the cooling gas to flow from the inverter intake port to the opening to cool the inverter.

Effects of the Invention

According to the present invention, a package-type fluid machine in which the cooling efficiency of the inverter is improved can be realized.

MODE FOR CARRYING OUT THE INVENTION

Hereinafter, an embodiment of the present invention will be described with reference to the drawings.

Figure 1A:
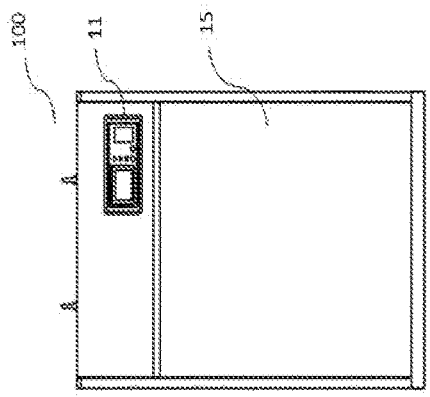
FIGS. 1A to 1C illustrate front view and side views of a package-type fluid machine in a first embodiment.

FIG. 1(a) is a front view of a package-type fluid machine 100 in a first embodiment. A front panel 15 forming a part of a casing of the package-type fluid machine 100 can be attached to and removed from a portion of the casing other than the front panel by a holding mechanism such as screws.

In addition, an operation panel 11 through which the package-type fluid machine 100 is operated is disposed in a front surface of the package-type fluid machine 100.

The front panel 15 is a panel that covers the front surface of the package-type fluid machine 100 except a position where the operation panel is located, and when the front panel 15 is removed, maintenance of internal components or the like can be performed.

Figure 1B:
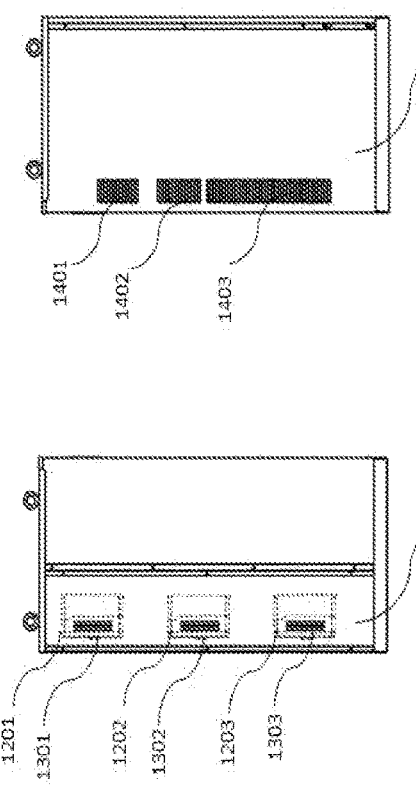

FIG. 1(b) is a side view on a left side of the package-type fluid machine 100 when seen from the front.

A first stage inverter 1201, a second stage inverter 1202, and a third stage inverter 1203 illustrated by dotted lines are disposed on a back surface side of a left side surface of a casing 16 in order from above.

In addition, the casing 16 is provided with a first stage side intake port 1301 for an inverter which takes in outside air to cool the first stage inverter 1201, a second stage side intake port 1302 for an inverter which cools the second stage inverter 1202, and a third stage side intake port 1303 for an inverter which cools the third stage inverter 1203 in order from above.

Figure 1C:
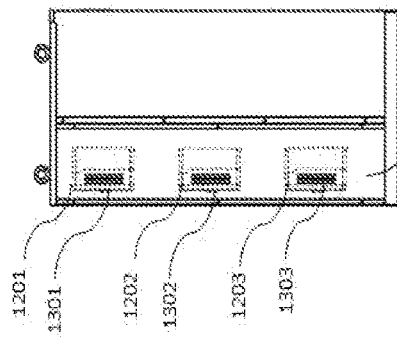

FIG. 1(c) is a side view on a right side of the package-type fluid machine 100 when seen from the front.

A first main intake port 1401, a second main intake port 1402, and a third main intake port 1403 that take in outside air which is a fluid to be compressed by a compression portion are disposed from above on a front surface side of a right side surface of the casing 16.

The side intake ports 1301, 1302, and 1303 for inverters and the main intake ports 1401, 1402, and 1403 are disposed opposite to each other when seen from the front. Therefore, the amount of intake air for cooling the inverters and the amount of intake fluid to be compressed can be increased without interference between both the intakes.

Figure 2A:
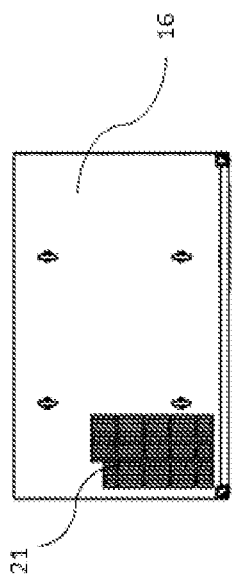
FIGS. 2A and 2B illustrate a top view and a back view of the package-type fluid machine in the first embodiment.
Figure 2B:
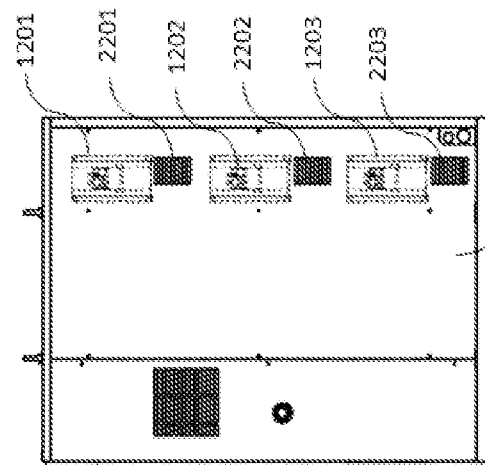

FIG. 2(*a*) is a top view of the package-type fluid machine 100.

An exhaust port 21 through which gas that has cooled the inverter, the compression portion, and a primary aftercooler is exhausted to the outside is disposed in a leftward direction of the front surface side in an upper surface of the casing 16.

FIG. 2(*b*) is a back view of the package-type fluid machine 100.

As illustrated by dotted lines, the first stage inverter 1201, the second stage inverter 1202, and the third stage inverter 1203 are disposed in a back surface of the casing 16 in order from above.

In addition, the casing 16 is provided with a first stage back intake port 2201 for an inverter which takes in outside air to cool the first stage inverter 1201, a second stage back intake port 2202 for an inverter which cools the second stage inverter 1202, and a third stage back intake port 2203 for an inverter which cools the third stage inverter 1203 in order from above.

Figure 3A:
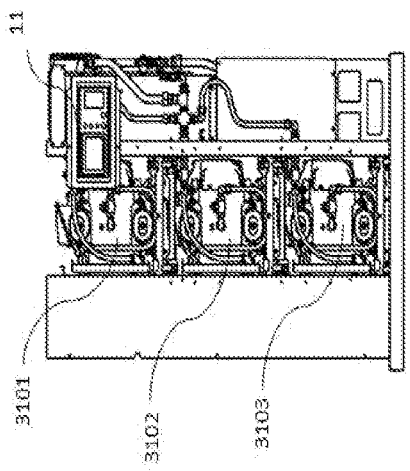
FIGS. 3A to 3C illustrate internal configuration views of the package-type fluid machine in the first embodiment when seen from the front and the side.
Figure 3C:
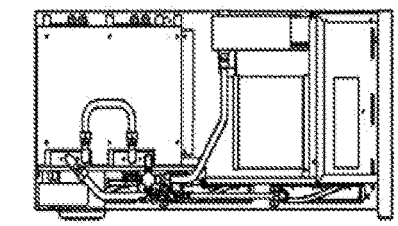
Figure 3B:
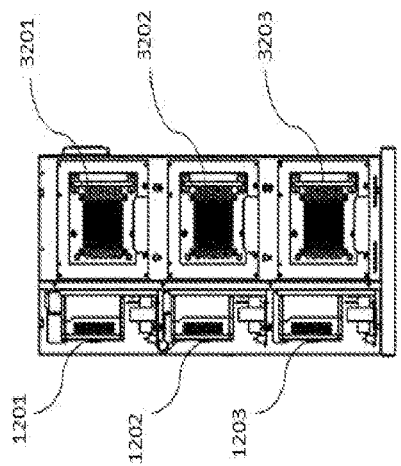

FIG. 3(*a*) is a view illustrating an internal configuration of the package-type fluid machine 100 when seen from the front.

A first stage compressor unit 3101, a second stage compressor unit 3102, and a third stage compressor unit 3103 are disposed in a central portion of the package-type fluid machine 100 in order from above.

The operation panel 11 which receives an operation instruction or displays a warning or the like is disposed on a right side of the first stage compressor unit 3101.

FIG. 3(*b*) is a view illustrating an internal configuration of the side surface on the left side of the package-type fluid machine 100 when seen from the front.

A first stage primary aftercooler 3201 which cools the fluid compressed by a compression portion of the first stage compressor unit 3101, a second stage primary aftercooler 3202 which cools the fluid compressed by a compression portion of the second stage compressor unit 3102, and a third stage primary aftercooler 3203 which cools the fluid compressed by a compression portion of the third stage compressor unit 3103 are disposed on a front surface side of the left side surface of the package-type fluid machine 100 in order from above.

The first stage inverter 1201 which controls a motor of the first stage compressor unit 3101, the second stage inverter 1202 which controls a motor of the second stage compressor unit 3102, and the third stage inverter 1203 which controls a motor of the third stage compressor unit 3103 are disposed in order from above on the back surface side of the side surface of the package-type fluid machine 100 when seen from the left.

FIG. 3(*c*) is a view illustrating an internal configuration on the right side of the package-type fluid machine 100 when seen from the front. A secondary aftercooler or a dryer that cools the compressed fluid which has passed through the primary aftercoolers is disposed on the right side of the package-type fluid machine 100 when seen from the front.

The primary aftercoolers 3201, 3202, and 3203 are disposed on the left side when seen from the front, the secondary aftercooler and the dryer are separately disposed on the right side when seen from the front, and the primary aftercoolers 3201, 3201, and 3203 are disposed on the front surface side. In such a manner, maintenance work of the primary aftercoolers 3201, 3201, and 3203 can be easily performed from the front surface side.

Figure 4A:
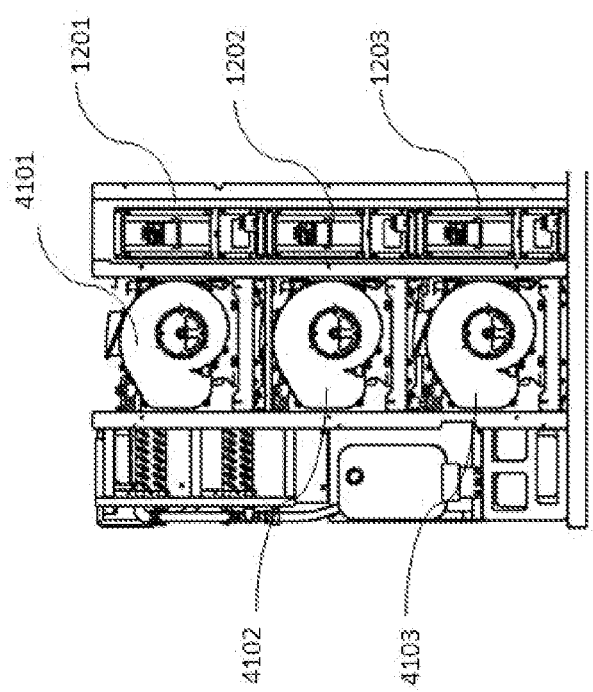
FIGS. 4A and 4B illustrate internal configuration views of the package-type fluid machine in the first embodiment when seen from the back and the top.

FIG. 4(*a*) is a view illustrating an internal configuration of the package-type fluid machine 100 when seen from the back. A first stage cooling duct 4101 of the first stage compressor unit 3101, a second stage cooling duct 4102 of the second stage compressor unit 3102, and a third stage cooling duct 4103 of the third stage compressor unit 3103 are disposed in a central portion of the package-type fluid machine 100 in order from above.

The first stage inverter 1201, the second stage inverter 1202, and the third stage inverter 1203 are disposed in order from above on the right side when seen from the back.

FIG. 4(*b*) is a view illustrating an internal configuration of the package-type fluid machine 100 when seen from the top.

The first stage compressor unit 3101 is disposed in a central portion, and the compression portion, the motor, and a cooling fan are disposed in a backward direction in order from the front surface side.

The cooling duct 4101 which allows the cooling gas to flow from the cooling fan toward the compression portion and extends toward the front surface side is disposed on the right side of the first stage compressor unit 3101 when seen from the front. A cooling duct having the same configuration is disposed below the first stage compressor unit 3101.

The first stage primary aftercooler 3201 is disposed on the left side of the package-type fluid machine 100 when seen from the front.

In addition, the first stage inverter 1201 is disposed on a back surface side of the first stage primary aftercooler 3201.

Figure 5:
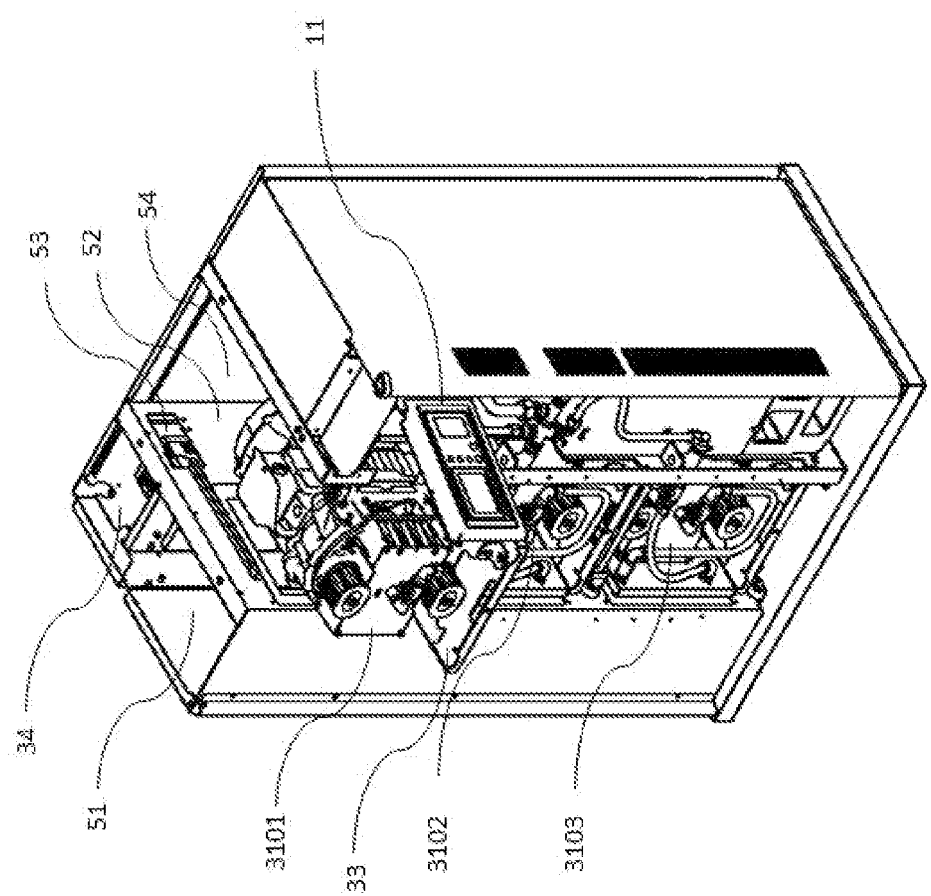
FIG. 5 is a perspective view illustrating an internal configuration of the package-type fluid machine in the first embodiment.

FIG. 5 is a perspective view illustrating an internal configuration of the package-type fluid machine 100 in the first embodiment.

Drawer mechanisms 33 including pedestals on which the compressor units 3101, 3102, and 3103 are placed, respectively, are provided. When maintenance is performed, the drawer mechanisms 33 can be used to draw the compressor units 3101, 3102, and 3103 out to the front surface, respectively. Here, the drawer mechanism 33 includes the pedestal, a rail, a caster, and the like.

An inverter intake port which takes in outside air into an inverter chamber 34 where the inverter is disposed is provided in a side surface and a back surface of each of the inverter chambers. The cooling gas which is taken in from the inverter intake port by the drive of the cooling fan is suctioned toward the cooling fan through an opening 53 provided in a partition wall 52 that partitions off the inverter chamber 34 from a machine chamber 54 which is adjacent to the inverter chamber 34 and in which compressor units 31 are disposed.

Then, the cooling gas cools the compression portion and cools the primary aftercooler 3201 through the cooling duct 4101 illustrated in FIG. 4, and then is released to the outside from the exhaust port 21 through an exhaust duct 51.

As illustrated in FIG. 2(*b*), on a back surface of each stage of the inverters, inverter intake ports 2201, 2202, and 2203 are provided below the inverters, respectively, and the opening 53 is provided on an upper side of each of the inverters. Since the inverter intake port 2201 and the opening 53 are located at different upper and lower positions, the cooling gas taken in from the intake port flows by the inverter from below to above, so that the entirety of the inverter can be cooled. The positional relationship between the inverter intake port and the opening may be such that the inverter intake port is located on an upper side and the opening is located on a lower side.

At least three openings 53 are provided in the partition wall 52 to correspond to the stages of the compressor units 3101, 3102, and 3103, respectively.

The inverter chamber 34 including the inverter intake port and the machine chamber 54 in which the compressor unit 3101 is disposed are disposed on a back surface side of the package-type fluid machine 100 in a state where both the chambers are adjacent to each other. Further, the opening 53 is provided on the back surface side of the package-type fluid machine 100, and the cooling fan is disposed on a side where the opening 53 is located. For this reason, unlike Patent Document 1, the intake port and the cooling fan are not separated from each other by the length of the motor or more. As a result, according to the first embodiment, the cooling gas having a flow rate sufficient to cool the inverter or the compression portion can be suctioned from the inverter intake port by the drive of the cooling fan, so that the cooling efficiency of the inverter or the like can be improved.

The exhaust duct 51 is disposed on a front surface side of a left side of the machine chamber 54, in which the compressor units 3101, 3102, and 3103 are disposed, when seen from the front.

The inverter chambers 34 are disposed in three stages on a back surface side of the exhaust duct 51 to correspond to the compressor units 3101, 3102, and 3103, and the inverter which controls the motor is disposed in each of the inverter chambers 34.

As illustrated in FIG. 5, the compressor units 3101, 3102, and 3103 which are longer than the longitudinal dimension of the exhaust duct 51 are disposed on a right side of the exhaust duct 51 when seen from the front. Therefore, in order to effectively utilize a space on the back surface side of the exhaust duct 51, the inverter chambers 34 are disposed on the back surface side of the exhaust duct 51, so that the size of the package-type fluid machine 100 can be reduced.

Figure 6:
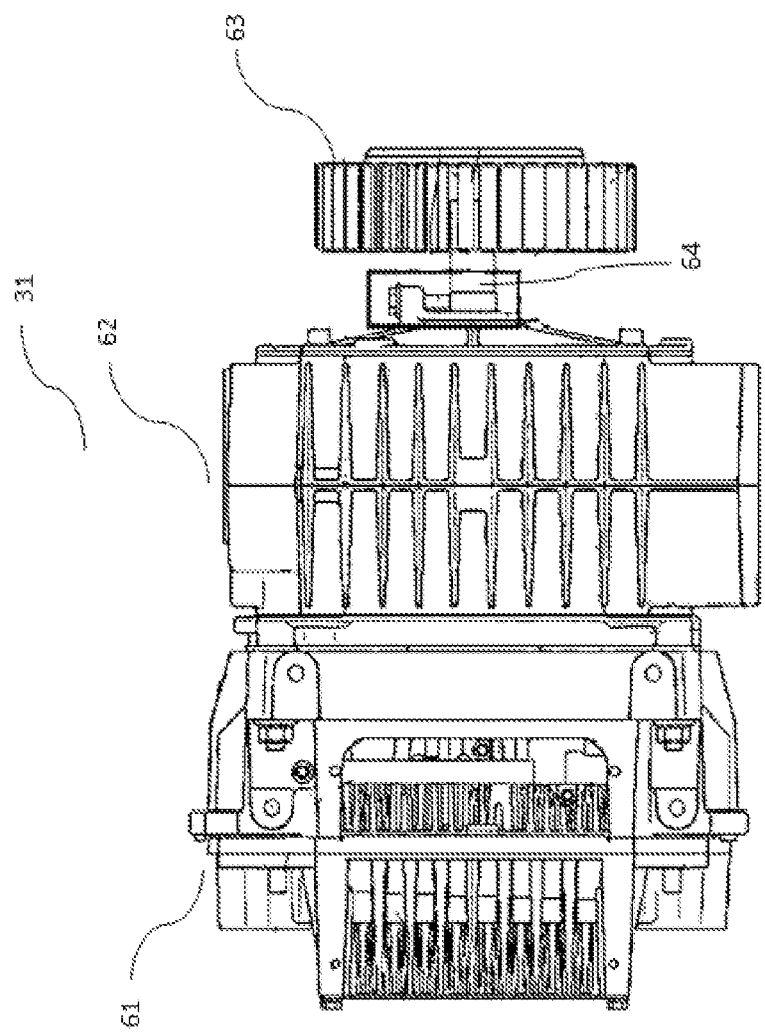
FIG. 6 is a view illustrating a compressor unit of the package-type fluid machine.

FIG. 6 is a view for describing the compressor unit 31. The compressor unit 31 includes a compression portion 61, a motor 62, and a cooling fan 63. In the present embodiment, the compression portion 61 is a scroll compressor, and the motor 62 is an axial gap type motor. A sirocco fan is used as the cooling fan 63.

In each of the compressor units 3101, 3102, and 3103, the compression portion 61, the motor 62, and the cooling fan 63 are disposed from the front surface side toward the backward direction. The compression portion 61 having a high maintenance frequency is disposed on the front surface side. For this reason, when the drawer mechanism 33 is used to draw the compression portion 61 out, maintenance work can be easily performed.

The motor 62 and the compression portion 61 of the compressor unit 31 are combined to form a compressor unit integrated with a motor. Since the motor 62 is an axial gap type motor having a structure where a rotor disposed in a disk shape and a stator rotate while facing each other, the motor 62 can be made thin. Further, since amorphous which is a material having high magnetic permeability and small core loss is used as the material of a stator core, the efficiency of the motor can be improved and the size of the motor can be further reduced.

The cooling fan 63 is installed on an end portion side of a rotary shaft 64 rotated by the motor 62. The cooling fan 63 has a structure where rotary blades mounted on the rotary shaft 64 are accommodated inside a fan cover made of resin.

The cooling fan 63 is a so-called suction type cooling fan that suctions outside air, which flows into the cooling fan 63 from a side surface of the cooling fan 63 by the rotation of the rotary blades driven by the rotary shaft 64, to generate cooling air.

Figure 4B:
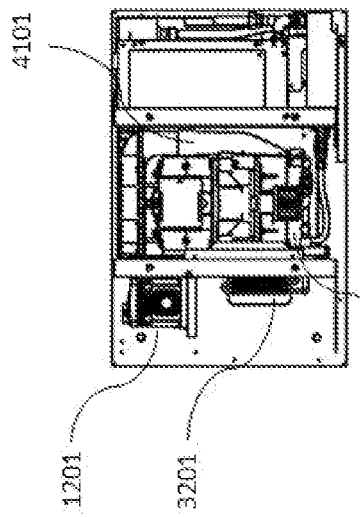

The cooling air generated inside the fan cover by the rotation of the rotary blades is supplied to a fixed scroll or an orbiting scroll of the scroll compressor, which is the compression portion 61, through the cooling duct 4101 (refer to FIG. 4(b)) that is provided in a right side surface of the compressor unit 31 when seen from the front.

In the embodiment, a case where the number of the stages of the inverters, the compressor units, or the primary aftercoolers is 3 has been described; however, the number of the stages is not limited to 3, and a plurality of stages may be provided to make the set area of the package-type fluid machine 100 compact.

In addition, in the embodiment, a case where the compression portion is a scroll compressor and the motor is an axial gap type motor in which amorphous is used as the material of the stator core has been described; however, the compression portion may be a compressor such as a reciprocating compressor other than the scroll compressor. In addition, for example, a motor having another configuration, such as a radial gap type motor, can be used as the motor.

REFERENCE SIGNS LIST

11 Operation panel
Front panel
1201, 1202, 1203 Inverter
16 Casing
21 Exhaust port
2201, 2202, 2203 Back intake port for inverter
31, 3101, 3102, 3103 Compressor unit
3201, 3202, 3203 Primary aftercooler
34 Inverter chamber
51 Exhaust duct
52 Partition wall
53 Opening
54 Machine chamber
61 Compression portion
62 Motor
63 Cooling fan
100 Package-type fluid machine

The invention claimed is:
1. A package fluid machine having a main intake port that takes in the fluid, comprising:
a plurality of compressor units disposed in a plurality of stages in a longitudinal direction of the package fluid machine,
each of the plurality of compressor units including a compression portion that compresses a fluid, a motor that drives the compression portion, and a cooling fan that is driven by the motor;
wherein the compressor unit, the compression portion and the motor are arranged in the same stage,
a machine chamber in which the plurality of compressor units are disposed;
an inverter chamber which is adjacent to the machine chamber and in which multiple inverters are disposed in the longitudinal direction corresponding to the each of compressor units;

a partition wall that partitions off the machine chamber from the inverter chamber and has multiple openings corresponding to each of the compressor units; and a plurality of inverter intake ports that are disposed in the inverter chamber to take in a cooling gas to each of the multiple inverters, wherein for each of the plurality of the compressor units, the cooling fan is disposed on a side of the machine chamber, a respective opening of the multiple openings being located on the side, and the cooling fan is driven to cause the cooling gas to flow from a respective one of the inverter intake ports to the opening to cool the inverter.

2. The package fluid machine according to claim 1, wherein the inverters, the openings, and the cooling fans are disposed on a back surface side of the package fluid machine.

3. The package fluid machine according to claim 2, wherein the compression portions are disposed on a front surface side of the package fluid machine with respect to the motors.

4. The package fluid machine according to claim 1, wherein the inverter intake ports and the main intake ports are disposed on opposite sides when seen from a front side of the package fluid machine.

5. The package fluid machine according to claim 1, wherein the inverter intake ports and the openings are disposed at different positions in an upward and downward direction.

6. The package fluid machine according to claim 1, wherein each of the cooling fans is a sirocco fan.

7. The package fluid machine according to claim 1, wherein each of the compressor unit is an integral type in which the compression portion and the motor are combined.

8. The package fluid machine according to claim 7, wherein each of the motors is an axial gap type motor.

9. The package fluid machine according to claim 8, wherein each of the compression portions is a scroll compressor.

10. The package fluid machine according to claim 1, further comprising:

an exhaust duct that exhausts the cooling gas, wherein the inverter chamber is disposed on a back surface side of the exhaust duct.

11. The package fluid machine according to claim 1, wherein a cooling duct which supplies the cooling gas to each of the compression portions is disposed on a side surface of the compressor units.

12. The package fluid machine according to claim 1, further comprising:

a primary aftercooler, a secondary aftercooler, and a dryer that cool the fluid from each of the compression portions, wherein each of the compressor unit is disposed in a central portion of the package fluid machine, the primary aftercooler and the inverter chamber are disposed in a first end end portion of the package fluid machine, and the secondary aftercooler and the dryer are disposed in a second end portion of the package fluid machine.

* * * * *